US010209313B2

(12) United States Patent
Abe et al.

(10) Patent No.: US 10,209,313 B2
(45) Date of Patent: Feb. 19, 2019

(54) ACCUMULATOR DEVICE, AND STATE OF CHARGE EVALUATION APPARATUS AND METHOD FOR ACCUMULATOR

(75) Inventors: Keiko Abe, Mito (JP); Yasuhiro Kobayashi, Hitachinaka (JP); Masahiro Watanabe, Hitachi (JP); Hisaaki Takabayashi, Nabari (JP); Yoshikazu Hirose, Matsudo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 17 days.

(21) Appl. No.: 13/059,891

(22) PCT Filed: Jun. 22, 2010

(86) PCT No.: PCT/JP2010/004137
§ 371 (c)(1),
(2), (4) Date: Feb. 18, 2011

(87) PCT Pub. No.: WO2011/039912
PCT Pub. Date: Apr. 7, 2011

(65) Prior Publication Data
US 2011/0196633 A1    Aug. 11, 2011

(30) Foreign Application Priority Data
Sep. 30, 2009    (JP) .................. 2009-225996

(51) Int. Cl.
*G06F 19/00*  (2018.01)
*G01R 31/36*  (2006.01)
(52) U.S. Cl.
CPC ..... *G01R 31/3651* (2013.01); *G01R 31/3624* (2013.01); *G01R 31/3679* (2013.01)
(58) Field of Classification Search
CPC ............ G01R 31/3624; G01R 31/3679; G01R 31/3651
(Continued)

(56) References Cited

U.S. PATENT DOCUMENTS 7,352,156 B2 *  4/2008  Ashizawa et al. ............ 320/132
8,046,181 B2 *  10/2011  Kang et al. ..................... 702/63
(Continued)

FOREIGN PATENT DOCUMENTS

JP    2001-281306    10/2001
JP    2003-035755     2/2003
(Continued)

OTHER PUBLICATIONS

Takae Shimada et al. Modeling Method for Lead-acid Battery Simulation Using Step Changing Current, The Institute of Electrical Engineers of Japan, Article B, vol. 128, No. 8, 2008.

*Primary Examiner* — Yoshihisa Ishizuka
(74) *Attorney, Agent, or Firm* — Fitch, Even, Tabin & Flannery LLP

(57) ABSTRACT

An accumulator and state of charge evaluation method for preparing, during charging and discharging, models for each of deterioration degrees, each representing a relationship between terminal voltage, current and state of charge, for selecting respective models for the times during charging and discharging in accordance with a total charging/discharging amount (Ah), a deterioration degree or an elapsed time of an operation of the accumulator, for further estimating state of charge from current accumulation, and for determining a final state of charge from estimated states of charge including a present state of charge estimated from the models for the times during charging and discharging of the accumulator, while using a time or a total charging/discharging amount (Ah) from a time of full-charging by equal charging of the accumulator up to present time to determine the final state of charge from the plurality of states of charge.

2 Claims, 6 Drawing Sheets

(58) Field of Classification Search
USPC ........... 702/63; 320/101, 132; 324/431, 429, 324/426; 72/63
See application file for complete search history.

(56) References Cited

U.S. PATENT DOCUMENTS

2007/0145949 A1* 6/2007 Matsushima et al. ........ 320/132
2008/0290835 A1* 11/2008 Hayashi ........................ 320/112
2009/0250277 A1* 10/2009 Grand et al. ............. 180/65.265

FOREIGN PATENT DOCUMENTS

| JP | 2004-286642 | 10/2004 |
| JP | 2005-001491 | 1/2005 |
| JP | 2006-034230 | 2/2006 |

* cited by examiner

ACCUMULATOR DEVICE, AND STATE OF CHARGE EVALUATION APPARATUS AND METHOD FOR ACCUMULATOR

TECHNICAL FIELD

The present invention relates to precisely recognizing the state of charge (SOC) of an accumulator used to suppress fluctuations in wind power electricity generation in, e.g., a wind power electricity generation system, and thereby increasing the lifetime of the accumulator and reducing the cost of the system including the accumulator.

BACKGROUND ART

Global warming is a serious problem to all human beings. In each country, to retard and stop the progress of global warming, energy saving, the use of new energy which does not emit $CO_2$, and the like have been promoted.

In Japan also, to reduce $CO_2$ emissions, the government determines the goal of new energy introduction, and promotes the introduction of electricity generation using new energy such as solar light, wind power, or the like, while also giving subsidy or the like.

Wind power electricity generation and solar electricity generation use natural energy, and have the advantage of no emission of $CO_2$. However, because of their dependence on wind and weather, an electricity output generated thereby is not stable, resulting in concerns about an adverse effect on an electric power system and the deterioration of electric power quality. For the purpose of preventing such an adverse effect on an electric power system, when wind power electricity generation or solar electricity generation is introduced, it is requested to simultaneously introduce an accumulator system.

Concerning this point, a detailed description will be given. First, an electricity output generated by, e.g., wind power electricity generation significantly varies depending on wind conditions. If allowed to flow without any alteration, the generated electricity output exerts an adverse effect on the electric power quality of an electric power system. To prevent this, an accumulator system using a lead accumulator or the like produces an accumulator system output in accordance with the state of the electricity output generated by wind power. As a result, the electricity output generated by wind power and the accumulator system output are combined to allow a smoothed system output to flow to the electric power system, and enable avoidance of the adverse effect on the electric power quality.

Accordingly, a lead accumulator used for suppressing fluctuations in an electricity output generated by wind power is required to have a lifetime as long as that of wind power electricity generation equipment and lower cost. In this regard, the lifetime of the lead accumulator can be increased by ensuring proper operational conditions.

To thus ensure proper operational conditions and increase the lifetime of the accumulator, it is required to precisely recognize a remaining capacity as the present state of charge of the accumulator. If the state of charge can be precisely recognized, it is possible to increase the lifetime of the lead accumulator, and reduce cost (reduce the number of lead accumulators needed to suppress fluctuations in wind power output).

As a method for precisely recognizing the state of charge of a lead accumulator, a method disclosed in Patent Document 1 is known. In this method, a relational expression between the state of charge of an accumulator mounted in a vehicle, the terminal voltage and current thereof is obtained in advance, and the state of charge at the time of an idling stop is determined from the terminal voltage and current.

In Patent Document 2, a method is disclosed in which, when the state of charge of an accumulator is sensed, a determination method is changed such that, if the state of charge in a region in a high state of charge is sensed, it is determined from the relation between a discharging voltage and a discharging current or, if the state of charge in a region in a low state of charge is sensed, it is determined from the relation between a charging voltage and a charging current, and estimation accuracy is thereby improved.

In Patent Document 3 also, a method is disclosed in which a state of charge is detected from the relation between an average voltage and an average current during a given time.

Each of the conventional methods is a method in which a relational model between the state of charge of the accumulator, the terminal voltage and current thereof is produced in advance and, from the present measurement values of the terminal voltage and current, the present state of charge of the accumulator is estimated.

PRIOR ART DOCUMENTS

Patent Documents

Patent Document 1: Japanese Unexamined Patent Publication No. 2005-1491
Patent Document 2: Japanese Unexamined Patent Publication No. 2004-286642
Patent Document 3: Japanese Unexamined Patent Publication No. 2006-343230

Non-Patent Document

Non-Patent Document 1: "Modeling Method for Lead-Acid Battery Simulation Using Step Changing Current" (The Institute of Electrical Engineers of Japan, Article B, Vol. 128, No. 8, 2008)

SUMMARY OF INVENTION

Problems to be Solved by Invention

Conventionally, to precisely estimate the state of charge of an accumulator, a method has been considered in which a relational model between the state of charge of the accumulator, the terminal voltage and current thereof is produced in advance and, from the present measurement values of the terminal voltage and current, the present state of charge of the accumulator is to be estimated.

With the conventional method also, the relational model of the state of charge of the accumulator can be produced, but it is a model (stand-alone model) at the time when the accumulator is new. The (accumulator total capacity itself) and the characteristics of the state of charge of the accumulator greatly change (deteriorate) due to secular change (deterioration), but no consideration has been given to this point. One of major reasons for this is that a deterioration degree is not merely determined by years, but varies depending on operational conditions for the accumulator, and therefore the deterioration degree cannot be easily determined conventionally.

A task of the present invention is to implement a method which allows a present state of charge to be precisely estimated not only for a new battery, but also for a lead accumulator that has deteriorated with the lapse of a certain period since first use thereof, an accumulator device which can be increased in lifetime and reduced in cost using information on the precisely determined state of charge, and an accumulator state of charge evaluation apparatus and method.

Means for Solving the Problems

An accumulator device of the present invention includes: an accumulator; a terminal voltage measurement unit for measuring a terminal voltage of the accumulator; a current measurement unit for measuring a current flowing in the accumulator; multi-dimensional characteristic models in which a plurality of relational models each between the measured terminal voltage, current and a state of charge are prepared for each of deterioration degrees; a deterioration degree estimation unit for estimating a present deterioration degree of the accumulator; a corresponding model selective determination unit for selectively determining, based on the deterioration degree determined by the deterioration degree estimation unit, a corresponding model from among the multi-dimensional characteristic models; and a state of charge estimation unit for estimating the present state of charge using the model selectively determined by the corresponding model selective determination unit.

Alternatively, the accumulator device of the present invention includes: an accumulator; a terminal voltage measurement unit for measuring a terminal voltage of the accumulator; a current measurement unit for measuring a current flowing in the accumulator; a first transition measurement unit for measuring a transition from a time of first use of the accumulator; first multi-dimensional characteristic models in which a plurality of relational models each between the terminal voltage, current and a state of charge at a charge time are prepared for each of deterioration degrees; a first selecting means for selecting a characteristic model from among the first multi-dimensional characteristic models in accordance with an output of the first transition measurement unit; a first estimation unit for estimating the state of charge from the characteristic model selected by the first selecting means; a second transition measurement unit for measuring a transition from a time of equal charging; second multi-dimensional characteristic models in which a plurality of relational models each between the terminal voltage, current and the state of charge at a discharge time are prepared for each of the deterioration degrees; a second selecting means for selecting a characteristic model from among the second multi-dimensional characteristic models in accordance with an output of the second transition measurement unit; a second estimation unit for estimating the state of charge from the characteristic model selected by the second selecting means; a third estimation unit for estimating the state of charge from current accumulation; a weight determining means for determining respective weights to be imparted to the outputs of the first estimation unit and the second estimation unit and to an output of the third estimation unit from the transition from the time of equal charging obtained by the second transition measurement unit; and a determining means for finally determining the state of charge in accordance with the outputs of the first estimation unit, the second estimation unit, and the third estimation unit that are produced in consideration of the weights determined by the weight determining means.

A performance evaluation apparatus for an accumulator of the present invention includes: a terminal voltage measurement unit for measuring a terminal voltage of an accumulator; a current measurement unit for measuring a current flowing in the accumulator; multi-dimensional characteristic models in which a plurality of relational models each between the measured terminal voltage, current and a state of charge are prepared for each of deterioration degrees; a deterioration degree estimation unit for estimating a present deterioration degree of the accumulator; a corresponding model selective determination unit for selectively determining, based on the deterioration degree determined by the deterioration degree estimation unit, a corresponding model from among the multi-dimensional characteristic models; and a state of charge estimation unit for estimating the present state of charge using the model selectively determined by the corresponding model selective determination unit.

Alternatively, the performance evaluation apparatus for an accumulator of the present invention includes: a terminal voltage measurement unit for measuring a terminal voltage of an accumulator; a current measurement unit for measuring a current flowing in the accumulator; a first transition measurement unit for measuring a transition from a time of first use of the accumulator; first multi-dimensional characteristic models in which a plurality of relational models each between the terminal voltage, current and a state of charge at a charge time are prepared for each of deterioration degrees; a first selecting means for selecting a characteristic model from among the first multi-dimensional characteristic models in accordance with an output of the first transition measurement unit; a first estimation unit for estimating the state of charge from the characteristic model selected by the first selecting means; a second transition measurement unit for measuring a transition from a time of equal charging; second multi-dimensional characteristic models in which a plurality of relational models each between the terminal voltage, current and the state of charge at a discharge time are prepared for each of the deterioration degrees; a second selecting means for selecting a characteristic model from among the second multi-dimensional characteristic models in accordance with an output of the second transition measurement unit; a second estimation unit for estimating the state of charge from the characteristic model selected by the second selecting means; a third estimation unit for estimating the state of charge from current accumulation; a weight determining means for determining respective weights to be imparted to the outputs of the first estimation unit and the second estimation unit and to an output of the third estimation unit from the transition from the time of equal charging obtained by the second transition measurement unit; and a determining means for finally determining the state of charge in accordance with the outputs of the first estimation unit, the second estimation unit, and the third estimation unit that are produced in consideration of the weights determined by the weight determining means.

A state of charge evaluation method for an accumulator of the present invention includes the steps of: preparing, for each of deterioration degrees, a plurality of models each representing a relation between a terminal voltage, a current of the accumulator and a state of charge; estimating a present deterioration degree of the accumulator; selecting a relational model between the terminal voltage and current of the accumulator and the state of charge in accordance with the estimated deterioration degree; and estimating a present state of charge using the selected model.

Alternatively, the state of charge evaluation method for an accumulator of the present invention includes the steps of: preparing, for each of a charge time and a discharge time for an accumulator, a plurality of models each representing a relation between a terminal voltage and a current and a state of charge; selecting respective models for the charge time and the discharge time for the accumulator in accordance with a transition of an operation of the accumulator; and estimating a present state of charge from the models.

The state of charge evaluation method for an accumulator may also further include the steps of: estimating the state of charge also from current accumulation; and determining a final state of charge from among a plurality of states of charge including the present state of charge estimated from the models for the charge time and the discharge time for the accumulator.

In addition, for the determination of the final state of charge from among the plurality of states of charge, a transition from a time of equal charging may also be used.

Effects of Invention

According to the present invention, the state of charge of an accumulator which greatly differs depending on the use state (deterioration degree) thereof can be precisely recognized even when a certain period has elapsed since first use of the accumulator. By precisely recognizing the state of charge while also considering the deterioration of the accumulator, it is possible to increase the lifetime of the accumulator. By precisely recognizing the state of charge, it is possible to extend the use range (SOC use range), and use (reduce the cost of) the accumulator device with a small number of accumulators. That is, using state of charge information precisely determined while consideration is given also to the deterioration of the accumulator, it is possible to construct an accumulator for wind power electricity generation that has been increased in lifetime and reduced in cost, and an accumulator system.

DESCRIPTION OF EMBODIMENTS

Figure 1:
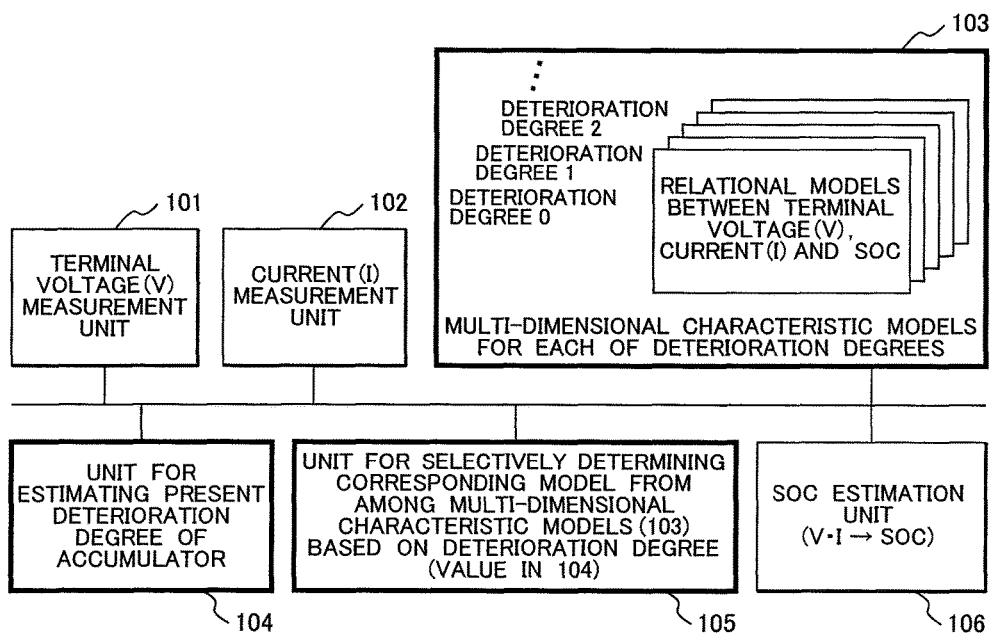
FIG. 1 A functional block diagram of an embodiment of the present invention.

Using the drawings, an embodiment of the present invention will be described hereinbelow in detail.
Embodiments
FIG. 1 shows a functional block diagram of an accumulator state of charge evaluation apparatus of the present invention. The functional blocks of the present invention include a terminal voltage measurement unit 101, a current measurement unit 102, multi-dimensional characteristic models 103, a deterioration degree estimation unit 104, a corresponding model selective determination unit 105, and a state of charge estimation unit (SOC estimation unit) 106.

A description will be given of each of the functions of the present invention. The terminal voltage measurement unit 101 measures a terminal voltage V of a lead accumulator. The current measurement unit 102 measures a current I flowing in the lead accumulator. The multi-dimensional characteristic models 103 are relational models each between the terminal voltage V, current I and a state of charge (SOC) which are prepared in multiple dimensions for each of deterioration degrees, and produced in advance by examining the characteristics of the lead accumulator.

The deterioration degree estimation unit 104 estimates the present deterioration degree of the accumulator. There is a method which determines the present deterioration degree of the accumulator using, as an index of the present deterioration degree of the accumulator, a total amount of charging and discharging (total charging/discharging amount (Ah)) since the initiation of use thereof.

The corresponding model selective determination unit 105 selectively determines, based on the present deterioration degree of the accumulator determined by the deterioration degree estimation unit 104, a model appropriate for the estimation of the state of charge (proper model corresponding to the present deterioration degree) from among the multi-dimensional characteristic models 103.

The state of charge estimation unit 106 estimates, based on the terminal voltage V measured by the terminal voltage measurement unit 101 and the current I measured by the current measurement unit 102, the present state of charge using the model (relational model between voltage V, current I and the state of charge) selectively determined by the corresponding model selective determination unit 105.

Note that, as an example of a method for estimating the present deterioration degree of the accumulator in the deterioration degree estimation unit 104, there is a method which determines the present deterioration degree using a total amount of charging and discharging (total charging/discharging amount (Ah)) since the initiation of use thereof.

As an example of a method for producing the relational models between the terminal voltage V, current I and the state of charge held in the multi-dimensional characteristic models 103 for each of the deterioration degrees, the procedure of producing a model is described in detail in Non-Patent Document 1.

Next, using FIG. 2, a description will be given of the process flow of an accumulator state of charge evaluation method of the present invention. First, in the terminal voltage measurement unit 101, the terminal voltage V of the accumulator is measured (Step S201). Then, in the current measurement unit 102, the current I in the accumulator is measured (Step S202). Then, in the deterioration degree estimation unit 104, the present deterioration degree of the accumulator is estimated (Step S203). The corresponding model selective determination unit 105 selects, based on the value (the present deterioration degree of the accumulator) estimated by the deterioration degree estimation unit 104, the corresponding relational model from among the multi-dimensional characteristic models 103 (Step S204).

Then, using the terminal voltage V of the accumulator measured in the terminal voltage measurement unit 101 (Step S201), the current I in the accumulator measured in the current measurement unit 102 (Step S202), and the model selected by the corresponding model selective determination unit 105, the state of charge estimation unit 106 estimates the present state of charge of the accumulator (Step S205). By the foregoing processing, the present state of charge of the accumulator can be estimated.

Figure 2:
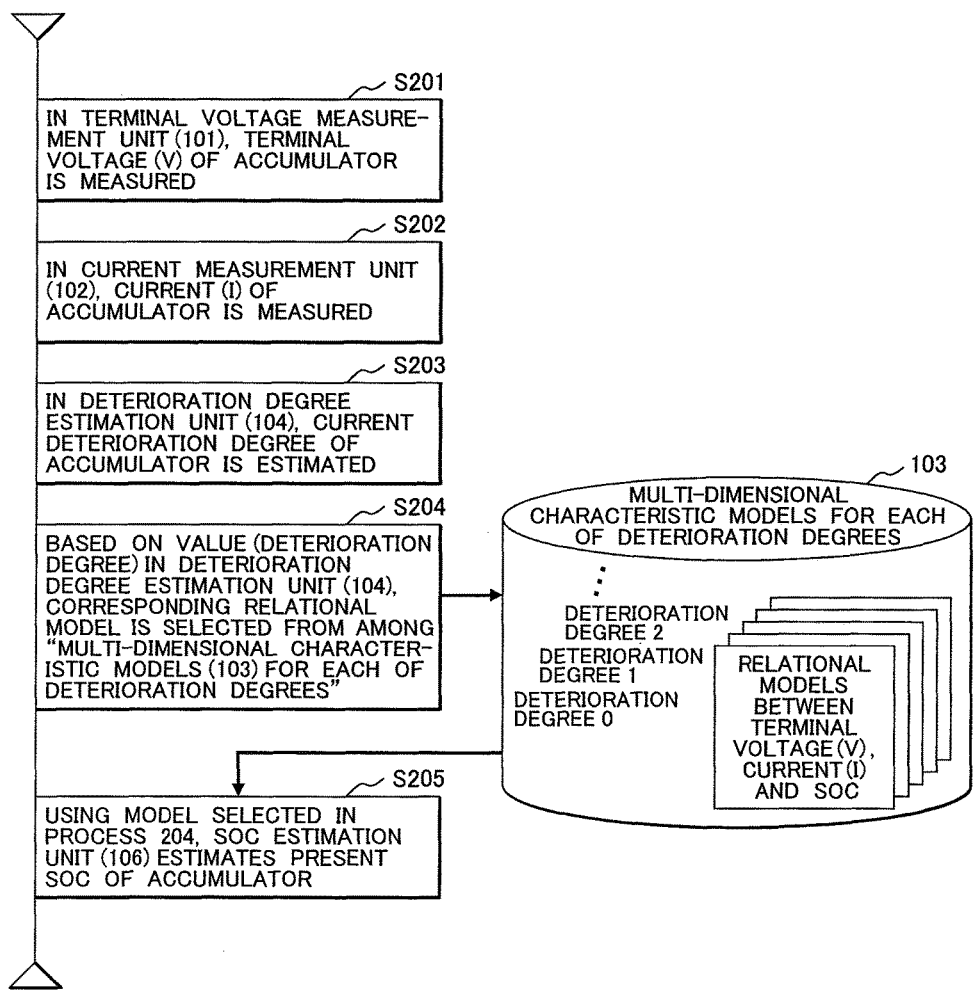
FIG. 2 A process flow chart of the embodiment of the present invention.

According to the state of charge evaluation method for accumulator of FIG. 2, the plurality of models each showing the relation between the terminal voltage, the current of the accumulator and the state of charge are prepared for each of the deterioration degrees of the accumulator, the present deterioration degree of the accumulator is estimated, the relational model between the terminal voltage, current of the accumulator and the state of charge is selected in accordance with the estimated deterioration degree and, using the selected model, the present state of charge can be estimated. Therefore, even when the accumulator is not new, the state of charge can be precisely estimated in accordance with the state of use thereof.

Thus far, using FIGS. 1 and 2, the accumulator state of charge evaluation apparatus and method according to the present invention have been described, in which the multi-dimensional characteristic models 103 for each of the deterioration degrees are used. Here, a description will be given of what the multi-dimensional characteristic models 103 are like.

Figure 5:
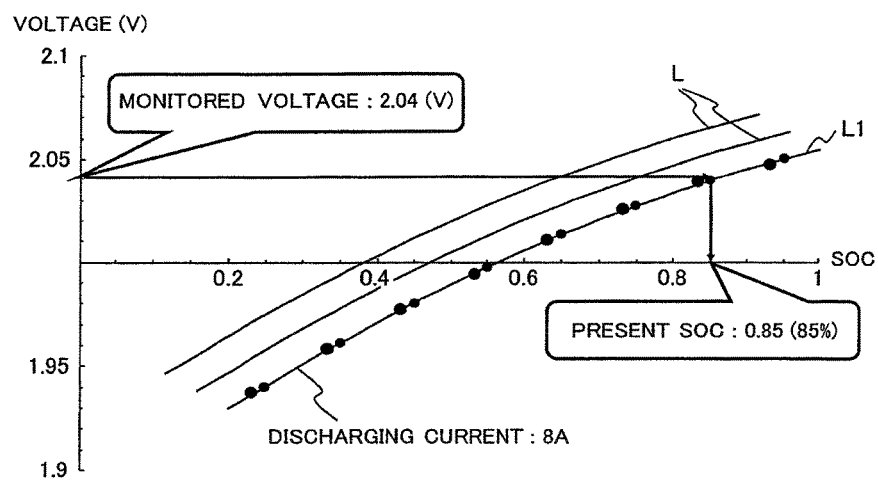
FIG. 5 An example of state of charge estimation using a discharge characteristic model.

The characteristic L1 shown in FIG. 5 shows an example of a discharge characteristic model when the accumulator is used in an environment in which the deterioration degree of the accumulator is 5%, a temperature is 25° C., and a discharging current is 8A. In the graph, the ordinate axis represents the voltage V (terminal voltage V), and the abscissa axis represents the state of charge (SOC).

According to the graph, if it is assumed that a current of 8A is allowed to flow in the environment in which the deterioration degree is 5% and the temperature is 25° C., and the terminal voltage at this time is measured to be 2.04 V, it can be seen (estimated), as shown in the drawing, that the state of charge of the lead accumulator at that time is 0.85 (85%).

As is obvious from the foregoing, as the multi-dimensional characteristic models 103 for each of the deterioration degrees, the characteristic L for another deterioration degree is also prepared in multiple sets, and an optimum characteristic is extracted according to the index of the measured deterioration degree to be used for the determination of the state of charge.

Figure 3:
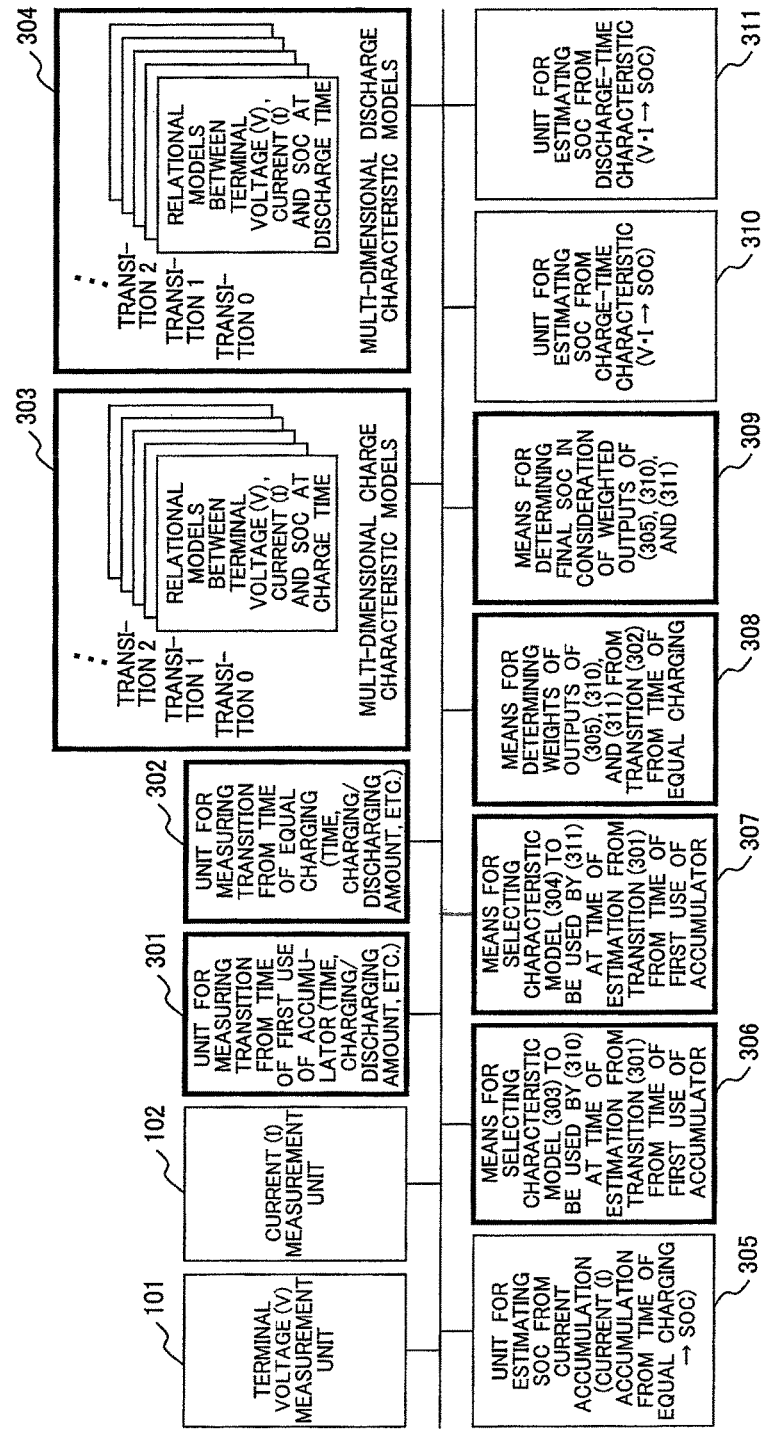
FIG. 3 A functional block diagram of the embodiment of the present invention.

FIG. 3 shows a detailed functional block diagram of another embodiment of the accumulator state of charge evaluation apparatus of the present invention. The functional blocks include four types of measurement units (101, 102, 301, and 302), two types of multi-dimensional characteristic models (303 and 304), two types of selecting means (306 and 307), three types of state of charge estimation units (305, 310, and 311), one weight determining means (308), and a means (309) for finally determining a state of charge.

Among them, the four types of measurement units (101, 102, 301, and 302) are the terminal voltage measurement unit 102, the current measurement unit 101, the unit 301 for measuring a transition from the time of first use of the accumulator, and the unit 302 for measuring a transition from the time of equal charging.

The two types of multi-dimensional characteristic models (303 and 304) are the multi-dimensional charge characteristic models 303 and the multi-dimensional discharge characteristic models 304.

The two selecting means (306 and 307) are the means 306 for selecting a model from among the multi-dimensional charge characteristic models 303 in accordance with an output of the unit 301 for measuring a transition from the time of first use of the accumulator and the means 307 for selecting a model from among the multi-dimensional discharge characteristic models 304 in accordance with the output of the unit 301 for measuring a transition from the time of first use of the accumulator.

The three types of state of charge (SOC) estimation units (305, 310, and 311) are the unit 305 for estimating a state of charge from current accumulation, the unit 310 for estimating a state of charge from charge characteristics, and the unit 311 for estimation from discharge characteristics.

The means 308 for determining weights performs weighting of outputs of the three types of state of charge estimation units (305, 310, and 311) in accordance with an output of the unit 302 for measuring a transition from the time of equal charging. The means (309) for finally determining a state of charge determines a state of charge from the weighted outputs of the three types of state of charge estimation units (305, 310, and 311).

Next, a description will be given of each of the functions. The terminal voltage measurement unit 101 measures the terminal voltage V of the lead accumulator. The current measurement unit 102 measures the current I flowing in the lead accumulator. The unit 301 for measuring a transition from the time of first use of the lead accumulator measures a transition (such as, e.g., the total charging/discharging amount (Ah), the deterioration degree, or an elapsed time) from the time of first use of the accumulator. The unit 302 for measuring a transition from the time of equal charging measures a transition (such as, e.g., a time or the total charging/discharging amount (Ah)) from the time when equal charging of the accumulator is performed.

The multi-dimensional charge characteristic models 303 are relational models each between the terminal voltage V, current I and the state of charge at a charge time which are prepared in multiple dimensions for each of transitions (for each of the deterioration degrees) from the time of first use of the accumulator. The multi-dimensional charge characteristic models 303 are produced in advance by examining the characteristics of the lead accumulator at the charge time. The multi-dimensional discharge characteristic models 304 are relational models each between the terminal voltage V, current I and the state of charge SOC at a discharge time which are prepared in multiple dimensions for each of the transitions (for each of the deterioration degrees) from the time of first use of the accumulator. The multi-dimensional discharge characteristic models 304 are also produced in advance by examining the characteristics of the lead accumulator at the discharge time.

Note that, in regard to a method for producing "Relational Models between Terminal voltage V, current I and State of Charge SOC" held in the multi-dimensional charge characteristic models 303 for each of the deterioration degrees and the multi-dimensional discharge characteristic models 304 for each of the deterioration degrees, the procedure of producing a model is described by way of example in Non-Patent Document 1.

The selecting means 306 selects a proper model from among the multi-dimensional charge characteristic models 303 in accordance with the value (present deterioration degree) of the unit 301 for measuring a transition from the time of first use of the accumulator. The selecting means 307 selects a proper model from among the multi-dimensional discharge characteristic models 304 in accordance with the value (present deterioration degree) of the unit 301 for measuring a transition from the time of first use of the accumulator.

The unit 305 for estimating a state of charge from current accumulation estimates a state of charge from accumulation of the current I from the time of equal charging.

The unit 310 for estimating a state of charge from charge characteristics estimates, based on the terminal voltage V measured by the terminal voltage measurement unit 101 and the current I measured by the current measurement unit 102 each at the charge time for the accumulator, the present state of charge using the model selectively determined by the selecting means 306 from among the multi-dimensional charge characteristic models 303.

The unit 311 for estimating a state of charge from discharge characteristics estimates, based on the terminal voltage V measured by the terminal voltage measurement unit 101 and the current I measured by the current measurement unit 102 each at the discharge time for the accumulator, the present state of charge using the model selectively determined by the selecting means 307 from among the multi-dimensional discharge characteristic models 304.

The means 308 for determining weights performs weighting of the outputs of the three types of state of charge estimation units (305, 310, and 311) based on the value of the unit 302 for measuring a transition from the time of equal charging.

That is, when a transition from the time of equal charging is relatively short, the degree of reliability of the value of the state of charge determined by the unit 305 for estimating a state of charge from current accumulation is relatively high. However, when the transition from the time of equal charging is relatively long, the degree of reliability of the value of the state of charge determined by the unit 305 for estimating a state of charge from current accumulation is relatively low. In this case, the state of charge determined in the unit 310 for estimating a state of charge from charge characteristics and the state of charge determined in the unit 311 for estimating a state of charge from discharge characteristics also become important. The weights of the states of charge determined by the three types of state of charge estimation units (305, 310, and 311) also vary depending on other factors such as the levels of the proportions of "charging" and "discharging" in a given time period from the present time. Accordingly, in accordance with the conditions, the weight determining means 308 performs weighting of the individual values.

Next, using FIG. 4, a description will be given of the process flow of the accumulator state of charge evaluation method of the present invention. In the process flow, various measurements are performed first.

In the terminal voltage measurement unit 101, the terminal voltage V of the accumulator is measured (Step S401). In the current measurement unit 102, the current I in the accumulator is measured (Step S402). In the unit 301 for measuring a transition from the time of first use of the accumulator, the transition (deterioration degree) of the accumulator up to the present time is measured (estimated) (Step S403). Further, in the unit 302 for measuring a transition from the time of equal charging, a transition from the time when the accumulator is full-charged by equal charging up to the present time is measured (Step S404).

Next, in the unit 305 for estimating a state of charge from current accumulation, a present state of charge is estimated (Step S405). The state of charge is estimated by accumulating the current I from the time of equal charging. Next, the selecting means 306 selects the corresponding relational model from among the models of the charge characteristic models 303 based on the result (transition/deterioration degree) obtained by the unit 301 for measuring a transition from the time of first use of the accumulator (Step S406).

The unit 310 for estimating a state of charge from charge characteristics estimates the present state of charge of the accumulator using the relational model selected in Step S406 (Step S407).

Likewise, the selecting means 307 selects the corresponding relational model from among the models of the charge characteristic models 304 based on the result (transition/ deterioration degree) obtained by the unit 301 for measuring a transition from the time of first use of the accumulator (Step S408).

Then, using the relational model selected in Step S408, the unit 311 for estimating a state of charge from discharge characteristics estimates the present state of charge of the accumulator (Step S409).

Next, the means 308 for determining weights determines weights (degrees of reliability) to be imparted to the respective states of charge determined in Steps S405, S407, and S409 based on the result (transition from the time of equal charging) obtained by the unit 302 for estimating a transition from the time of equal charging (Step S410).

Finally, the weights determined in Step S410 are imparted to the respective states of charge determined in Steps S405, S407, and S409, whereby the state of charge of the accumulator is finally determined.

Figure 4:
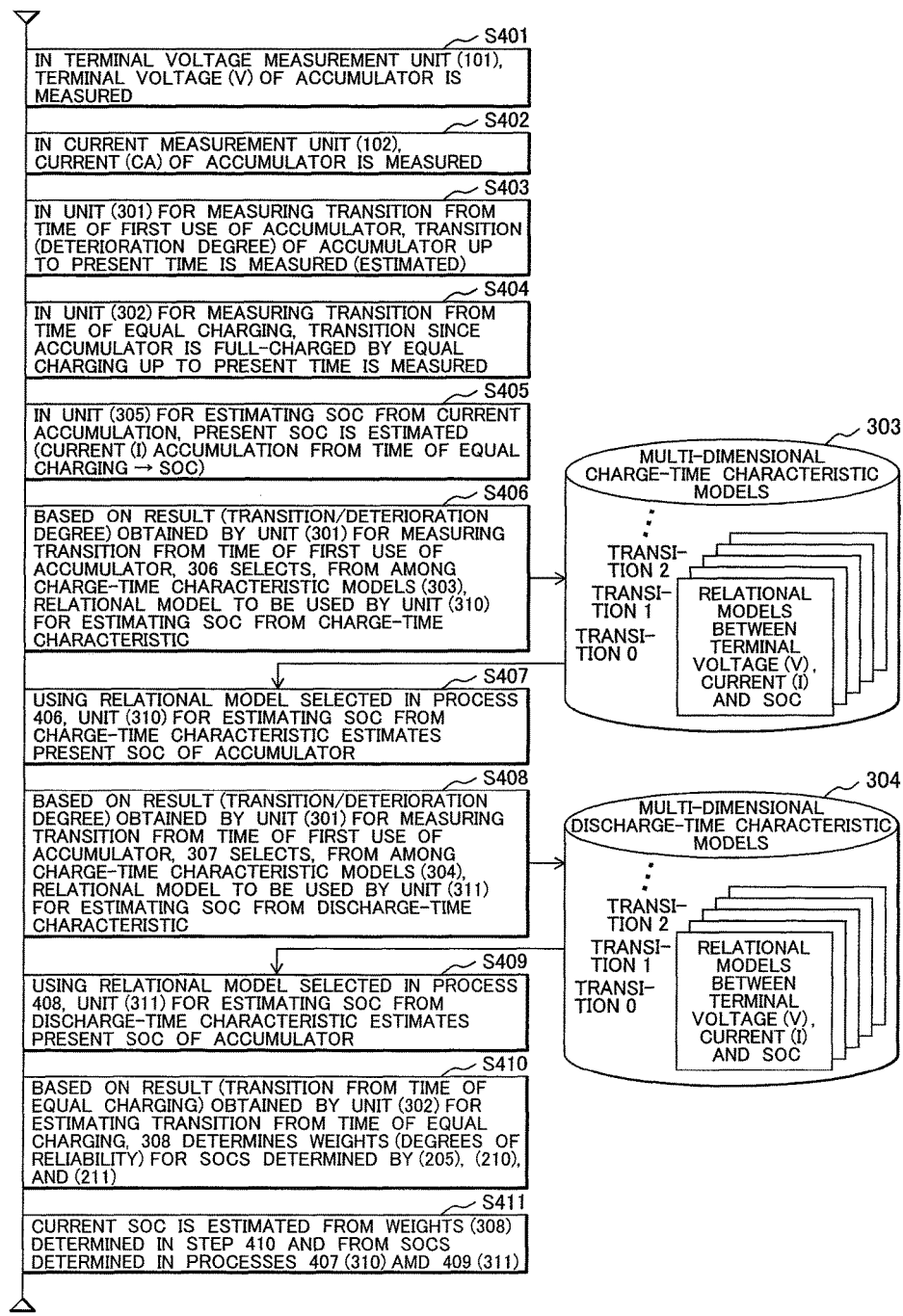
FIG. 4 A process flow chart of the embodiment of the present invention.

According to the state of charge evaluation method for accumulator of the present invention shown in FIG. 4, the plurality of models each representing the relation between the terminal voltage, current and the state of charge are prepared for each of the charge time and the discharge time for the accumulator, and respective models for the charge time and the discharge time for the accumulator are selected in accordance with the transition of the operation of the accumulator to allow the present state of charge to be estimated from these models. Therefore, the state of charge can be estimated with higher accuracy.

In addition, a state of charge is estimated also from current accumulation, and the final state of charge can be determined from among a plurality of states of charge including the present state of charge estimated from the models for the charge time and the discharge time for the accumulator.

For the determination of the final state of charge from the plurality of states of charge, a transition from the time of equal charging can be used.

Thus far, using FIGS. 3 and 4, the state of charge evaluation apparatus and method for accumulator according to the present invention have been described, in which the multi-dimensional characteristic models 303 and 304 are used. Here, a description will be given of what the multi-dimensional characteristic models 303 and 304 are like.

Figure 6:
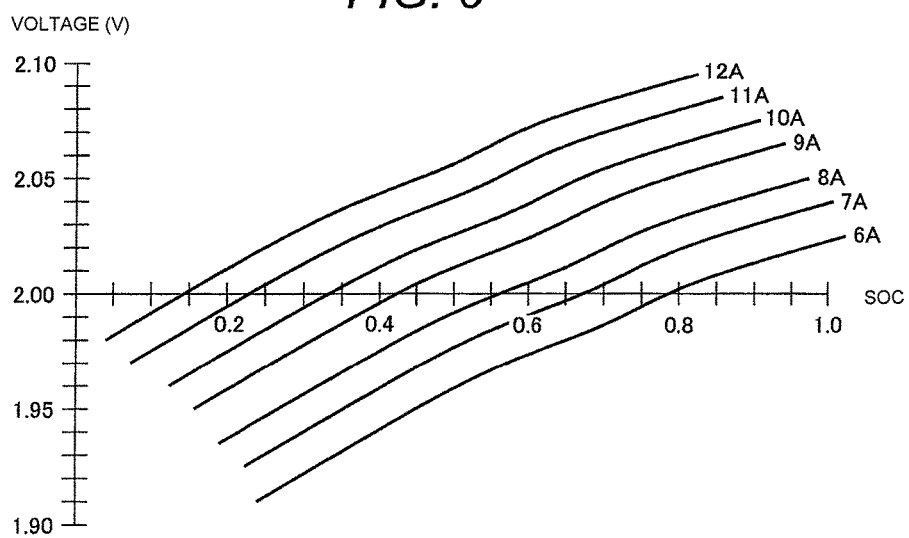
FIG. 6 An example of the discharge characteristic model.

FIG. 6 shows an example of the multi-dimensional discharge characteristic models of FIG. 3, and shows characteristics when a discharging current ranges from 8A to 12A in a usage environment in which, e.g., the deterioration degree is 5% and the temperature is 25° C. The multi-dimensional characteristic models are these plurality of characteristics which are each further prepared in multiple sets in terms of the result (transition/deterioration degree) obtained by the transition measurement unit 301.

Figure 7:
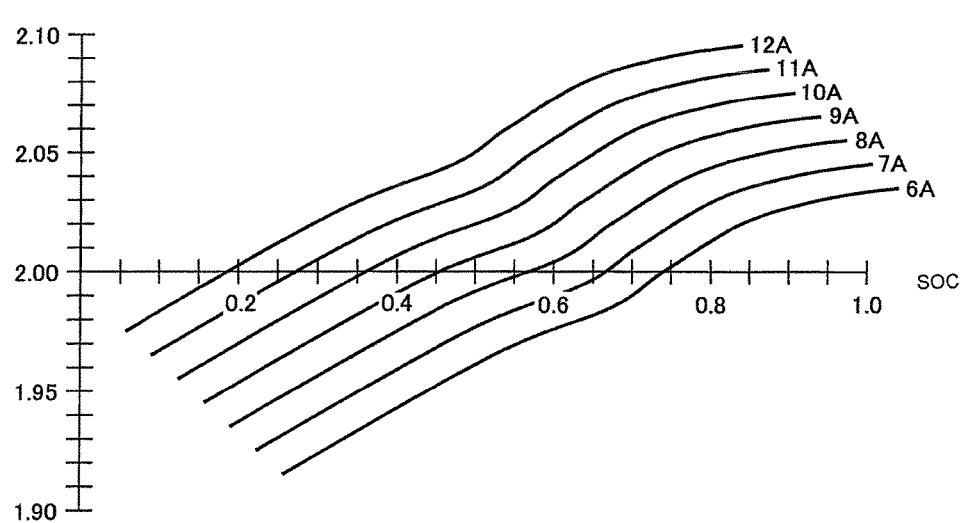
FIG. 7 An example of a charge characteristic model.

FIG. 7 shows an example of the multi-dimensional charge characteristic models of FIG. 3, and shows characteristics when a charging current ranges from 8A to 12A in a usage environment in which, e.g., the deterioration degree is 5% and the temperature is 25° C. The multi-dimensional characteristic models are these plurality of characteristics which are each further prepared in multiple sets in terms of the result (transition/deterioration degree) obtained by the transition measurement unit 302.

These multi-dimensional characteristic models associated with charging or discharging can also be developed into multi-dimensional models in terms of the deterioration degree of FIG. 5 or, alternatively, into multi-dimensional models in terms of a current as shown in FIGS. 6 and 7. Otherwise, the multi-dimensional characteristic models associated with charging or discharging can also be developed into multi-dimensional models in accordance with a temperature in an environment in which the accumulator is placed.

These multi-dimensional models studied from various viewpoints are actually formed of a calculator so that it is effective in estimating the present state of charge to include models developed with the largest possible number of factors.

Note that the foregoing state of charge evaluation apparatus for accumulator of the present invention can also be implemented separately and distinctly from the accumulator, e.g., as a remote calculator device. Alternatively, the state of charge evaluation apparatus for accumulator of the present invention can also be implemented as such an accumulator device as to allow the state of charge evaluation apparatus to be disposed at a place as a field site where the accumulator is disposed, and allow on-site performance confirmation.

In this manner, it is possible to practice the present invention.

INDUSTRIAL APPLICABILITY

According to the present invention, it is possible to recognize the details of the battery capacity of an accumulator, and therefore construct, e.g., an accumulator system for wind power electricity generation which has been increased in lifetime and reduced in cost.

Explanations of Letters and Numerals
- 101: Terminal Voltage Measurement Unit
- 102: Current Measurement Unit
- 301: Unit for Measuring Transition from Time of First Use of Accumulator
- 302: Unit 302 of Measuring Transition from Time of Equal Charging
- 303: Multi-Dimensional Charge characteristic Models
- 304: Multi-Dimensional Discharge characteristic Models
- 306, 307: Selecting Means
- 305, 310, 311: State of charge Estimation Unit
- 308: Weight Determining Means
- 309: State of charge Determining Means

The invention claimed is:

1. An accumulator device, comprising:
an accumulator and a state of charge evaluation apparatus for the accumulator;
a terminal voltage measurement unit configured to measure a terminal voltage of the accumulator;
a current measurement unit configured to measure a current flowing in the accumulator;
a first transition measurement unit configured to measure a total charging and discharging amount (Ah), a deterioration degree or an elapsed time from a time of first use of the accumulator, wherein the deterioration degree is an amount of deterioration of accumulator total capacity that varies over time depending on operational conditions for the accumulator;
first multi-dimensional characteristic models in which a plurality of relational models each between the terminal voltage, current and a state of charge during charging are prepared for each of deterioration degrees;
a first selecting means configured to select a characteristic model from among the first multi-dimensional characteristic models in accordance with the total charging and discharging amount (Ah), the deterioration degree or the elapsed time measured by the first transition measurement unit;
a first estimation unit configured to estimate the state of charge from the characteristic model selected by the first selecting means;
a second transition measurement unit configured to measure a transition time from a time of equal charging to a time when the accumulator is fully charged by equal charging or the total charging and discharging amount (Ah) from a time of equal charging to a time when the accumulator is fully charged by equal charging;
second multi-dimensional characteristic models in which a plurality of relational models each between the terminal voltage, current and the state of charge during discharging are prepared for each of the deterioration degrees;
a second selecting means configured to select a characteristic model from among the second multi-dimensional characteristic models in accordance with the total charging and discharging amount (Ah), the deterioration degree or the elapsed time measured by the first transition measurement unit;
a second estimation unit configured to estimate the state of charge from the characteristic model selected by the second selecting means;
a third estimation unit configured to estimate the state of charge from current accumulation;
a weight determining means configured to determine respective weights to be imparted to the outputs of the first estimation unit and the second estimation unit and to an output of the third estimation unit from the transition time or the total charging and discharging amount (Ah) from the time when the accumulator is fully charged by equal charging obtained by the second transition measurement unit; and
a determining means configured to finally determine the state of charge in accordance with the outputs of the first estimation unit, the second estimation unit, and the third estimation unit that are produced in consideration of the weights determined by the weight determining means.

2. A state of charge evaluation method for an accumulator, comprising the steps of:
charging and discharging an accumulator;
preparing, during charging and during discharging of the accumulator, a plurality of charge models for each deterioration degree, each representing a relation between a terminal voltage and a current and a state of charge;
preparing, during charging and during discharging of the accumulator, a plurality of discharge models for each deterioration degree, each representing a relation between a terminal voltage and a current and a state of charge;
selecting one of the plurality of charge models for a time during charging and one of the plurality of discharge models for a time during discharging for the accumulator in accordance with a total charging and discharging amount (Ah), a deterioration degree or an elapsed time of an operation of the accumulator, wherein the deterioration degree is an amount of deterioration of accumulator total capacity that varies over time depending on operational conditions for the accumulator;
estimating the state of charge from current accumulation from time of equal charging;
determining, based on an elapsed time of an operation of the accumulator or a total charging and discharging amount (Ah) from a time of equal charging, weights to be applied to each of the selected one of the plurality of charge models for a time during charging, the selected one of the plurality of discharge models for a time during discharging, and the state of charge from current accumulation from time of equal charging;

determining a final state of charge from the selected one of the plurality of charge models for a time during charging, the selected one of the plurality of discharge models for a time during discharging, and the state of charge from current accumulation from time of equal charging considering the determination of the weights applied to each of the selected one of the plurality of charge models for a time during charging, the selected one of the plurality of discharge models for a time during discharging, and the state of charge from current accumulation from time of equal charging; and operating the accumulator based on the determination the final state of charge.

\* \* \* \* \*